(12) United States Patent
Chen et al.

(10) Patent No.: US 11,355,562 B2
(45) Date of Patent: Jun. 7, 2022

(54) DISPLAY APPARATUS

(71) Applicant: KUNSHAN GO-VISIONOX OPTO-ELECTRONICS CO., LTD., KunShan (CN)

(72) Inventors: Xinquan Chen, KunShan (CN); Xiujian Zhu, KunShan (CN); Mingwei Ge, KunShan (CN); Zheng Wang, KunShan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 180 days.

(21) Appl. No.: 16/596,776

(22) Filed: Oct. 9, 2019

(65) Prior Publication Data
US 2020/0043994 A1 Feb. 6, 2020

Related U.S. Application Data

(63) Continuation of application No. PCT/CN2018/088798, filed on May 29, 2018.

(30) Foreign Application Priority Data

Sep. 30, 2017 (CN) .......................... 201721277955.7

(51) Int. Cl.
*H01L 27/32* (2006.01)
*H01L 51/52* (2006.01)
(Continued)

(52) U.S. Cl.
CPC .......... *H01L 27/3234* (2013.01); *G06V 40/13* (2022.01); *H01L 27/3262* (2013.01); *H01L 51/5203* (2013.01); *H01L 27/1214* (2013.01)

(58) Field of Classification Search
CPC ...... G02F 1/133; G09G 3/3225; G09G 3/325; H01L 27/3262; H01L 51/5203
See application file for complete search history.

(56) References Cited

U.S. PATENT DOCUMENTS

| | | | |
|---|---|---|---|
| 2007/0171345 A1 | 7/2007 | Shin | |
| 2011/0057908 A1* | 3/2011 | Park | ........................ G06F 3/042 349/24 |

(Continued)

FOREIGN PATENT DOCUMENTS

| | | |
|---|---|---|
| CN | 103681755 A | 3/2014 |
| CN | 107004130 A | 8/2017 |

(Continued)

OTHER PUBLICATIONS

First Office Action of Japanese Application No. 2019-563401.
(Continued)

*Primary Examiner* — Vongsavanh Sengdara
(74) *Attorney, Agent, or Firm* — Kilpatrick Townsend & Stockton (57) ABSTRACT

Disclosed is a display apparatus, comprising a first display region serving as a fingerprint identification region and a second display region serving as a display region, and comprising a display layer and a driver layer stacked in a stacking direction perpendicular to a plane where the display apparatus is placed. The display layer comprises a first electrode layer and a second electrode layer stacked in the stacking direction, and the driver layer comprises a plurality of driver units. In the first display region, the first electrode layer has a first part corresponding to the first display region, the second electrode layer has a second part corresponding to the first display region, and a projection of the first part in the stacking direction and a projection of the second part in the stacking direction are not completely overlapped.

10 Claims, 6 Drawing Sheets

(51) Int. Cl.
*G06V 40/13* (2022.01)
*H01L 27/12* (2006.01)

(56) References Cited

U.S. PATENT DOCUMENTS

| | | | |
|---|---|---|---|
| 2011/0096047 | A1 | 4/2011 | Endo |
| 2014/0077186 | A1 | 3/2014 | Kim |
| 2016/0064460 | A1 | 3/2016 | Kim et al. |
| 2017/0161543 | A1* | 6/2017 | Smith ................ G06V 40/1318 |
| 2018/0005005 | A1 | 1/2018 | He et al. |
| 2018/0323243 | A1* | 11/2018 | Wang .................... G09G 3/3216 |
| 2018/0373945 | A1* | 12/2018 | Wu ........................ G06V 40/70 |
| 2019/0130822 | A1 | 5/2019 | Jung et al. |
| 2019/0236327 | A1 | 8/2019 | Jia et al. |
| 2020/0019747 | A1 | 1/2020 | Yang et al. |

FOREIGN PATENT DOCUMENTS

| | | |
|---|---|---|
| CN | 107093617 A | 8/2017 |
| CN | 107122750 A | 9/2017 |
| CN | 107194321 A | 9/2017 |
| CN | 107863370 A | 3/2018 |
| JP | 2011118877 A | 6/2011 |
| WO | 2017164680 A1 | 9/2017 |

OTHER PUBLICATIONS

International Search Report dated Aug. 8, 2018 in the corresponding International application (application No. PCT/CN2018/088798).
CN First Office Action dated Mar. 8, 2018 in the corresponding CN application(application No. 201721277955.7).
Preliminary Publication, Current Technology: the method of increasing the brightness of the fingerprint source under the screen or increasing the maximum brightness of the screen increases the intensity of the light received by the fingerprint sensor, thereby improving the fingerprint recognition rate.
First Office Action of Korean Application No. 10-2019-7033177.
Supplementary European Search Report of Application No. 18861187.5.

* cited by examiner

DISPLAY APPARATUS

CROSS-REFERENCES TO RELATED APPLICATIONS

This application is a continuation application of International Patent Application No. PCT/CN2018/088798 with an international filing date of May 29, 2018, designating the United States, now pending, and further claims priority benefits to Chinese Patent Application No. 201721277955.7, filed on Sep. 30, 2017. The contents of all of the aforementioned applications, are incorporated herein by reference.

TECHNICAL FIELD

The disclosure relates to the field of display technologies, and more particularly to a display apparatus.

BACKGROUND OF THE INVENTION

An Organic Light Emitting Diode (OLED) apparatus has the advantages of autoluminescence, low driving voltage, high luminous efficiency, short response time, high definition and contrast, wide viewing, capability of implementing flexible displaying and large-area full-color displaying, etc., Therefore, OLED display technology is considered as a most potential display technology in the industry.

For an Active Matrix OLED (AMOLED), a thin film transistor cooperates with a capacitor to store signals, so as to control the brightness and the gray-scale performance of the OLED. Each of independent OLEDs is electrically connected with the corresponding thin film transistor to form a pixel matrix. An array circuit formed by the thin film transistors determines luminous conditions of pixels, so as to determine the constitution of an image. The AMOLED generally serves as a large-sized display apparatus thanks to its advantages of size enlargement, power saving, high resolution, relatively long panel life and the like.

At the present, with the development of the information industry, electronic products have come into an era of intelligence. Due to the uniqueness of a fingerprint pattern, to improve the safety and convenience of use of the electronic products, many electronic products are equipped with a fingerprint pattern identification module to enhance the safety of devices.

However, due to a large pixel density and a small effective area of light-transmitting holes of pixel units, a high PPI AMOLED screen body having full high definition and above in the prior art causes low overall light transmittance and thus causes the problem of low fingerprint identification sensitivity under optical screen.

SUMMARY OF THE INVENTION

The disclosure aims to overcome a defect of low light transmittance of a fingerprint module of a display apparatus.

In view of the defect, the disclosure provides a display apparatus. The display apparatus comprises a first display region serving as a fingerprint identification region and a second display region serving as a display region. The display apparatus comprises a display layer and a driver layer stacked in a stacking direction perpendicular to a plane where the display apparatus is placed. The display layer comprises a first electrode layer and a second electrode layer stacked in the stacking direction, and the driver layer comprises a plurality of driver units. In the first display region, the first electrode layer has a first part corresponding to the first display region, the second electrode layer has a second part corresponding to the first display region, and a projection of the first part in the stacking direction and a projection of the second part in the stacking direction are not completely overlapped.

By partially removing electrodes of the part corresponding to the first electrode layer and/or the part corresponding to the second electrode layer in a display unit in a predetermined region of the display layer and/or by omitting the driver circuits in part of the driver units in the predetermined region, an effect of improving the light transmittance of the predetermined region of the display layer may be achieved.

Optionally, in the first display region, at least one of the first electrode layer and the second electrode layer has a plurality of openings.

Optionally, in the first display region, the first electrode layer and the second electrode layer comprises a plurality of electrode units.

Optionally, the openings are arranged in rows, and the electrode units are arranged in rows; and the rows arranged by the openings are alternate with the rows arranged by the electrode units.

By removing the first electrode layer and/or the second electrode layer in the display apparatus every other row, when the first display region is a fingerprint identification region, the objective of improving the light transmittance of the fingerprint identification region is achieved, thus increasing the identification rate of the fingerprint module.

Optionally, the openings are arranged in rows, and the electrode units are arranged in rows. The number of the rows arranged by the openings is less than the number of the rows arranged by the electrode units.

Optionally, the openings and the electrode units are alternately arranged.

By removing the first electrode layer and/or the second electrode layer in the first display region in the display apparatus every other electrode unit, when the first display region is the fingerprint identification region, the whole light transmittance of the fingerprint identification region is improved. In addition, lights of the whole display apparatus are transmitted more uniformly, so the subsequent fingerprint identification algorithm is relatively convenient to process.

Optionally, at least two electrode units are continuously arranged, and the rest electrode units and the openings are alternately arranged.

Optionally, in the stacking direction, a projection of at least one of the electrode units in the first electrode layer is overlapped with a projection of a corresponding number of the electrode units in the second electrode layer.

Optionally, the display layer further comprises an organic light emitting layer arranged between the first electrode layer and the second electrode layer.

The display apparatus according to an embodiment of the disclosure achieves the effect of improving the light transmittance of a predetermined region of the display layer.

Optionally, the organic light emitting layer comprises a plurality of organic light emitting units, and the plurality of organic light emitting units and corresponding electrode units in the first electrode layer and the second electrode layer form light emitting display units.

Optionally, the display units comprise a plurality of first units and second units, each of the first units is an intact organic light emitting diode unit and comprises a first electrode unit, an organic light emitting unit and a second electrode unit which are stacked, and each of the second units is a non-intact organic light emitting diode unit and comprises an organic light emitting unit or further comprises one of the first electrode unit and the second electrode unit.

Optionally, the first electrode unit and the second electrode unit have the same independent quadrangles shapes.

Optionally, the first electrode layer is a continuous film layer having a plurality of openings, or comprises the separated first electrode units prepared on the same layer and having the same shapes.

Optionally, the second electrode layer is a continuous film layer having a plurality of openings, or comprises the separated second electrode units prepared on the same layer and having the same shapes.

Optionally, the first units have the same polygons shapes, and the second units have the same polygons shapes.

Optionally, not each of the driver units comprises a driver circuit.

Numerals in the drawings: I: first display region; II: second display region: 10: first electrode layer; 20: organic light emitting layer; 30: second electrode layer; 40: display unit; 41: first electrode unit; 42: second electrode unit; 43: opening; 50: driver layer; 51: third unit; and 52: fourth unit.

DETAILED DESCRIPTION OF THE INVENTION

Figure 1:
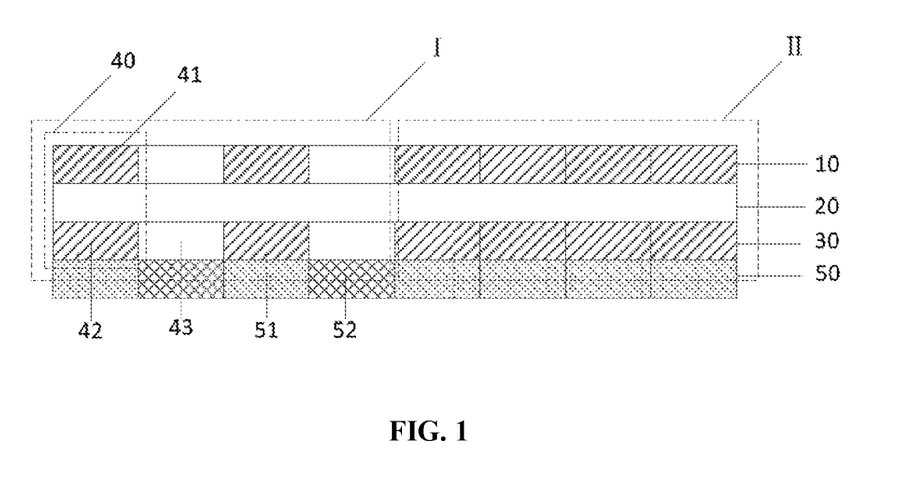
FIG. 1 is a structural schematic diagram of a longitudinal cross section of a display apparatus in an embodiment of the disclosure.

As shown in FIG. 1, an embodiment of the disclosure provides a display apparatus, comprising a display layer and a driver layer 50 which are stacked in a stacking direction perpendicular to a plane where the display apparatus is placed. The display layer comprises a plurality of display units 40 arranged in the same plane. The driver layer 50 comprises a plurality of driver units (such as Thin Film Transistors (TFT)) arranged in the same plane. Each of the display units and each of the driver units are in one-to-one correspondence arrangement.

The display layer comprises a first electrode layer 10, an organic light emitting layer 20 and a second electrode layer 30 which are stacked. The first electrode layer 10 comprises a plurality of first electrode units 41, and the second electrode layer 30 comprises a plurality of second electrode units 42. To clearly describe the objectives of the disclosure, in the following descriptions, the first electrode layer 10 and the second electrode layer 30 are described in detail by taking an electrode layer composed of 4 (the number of rows)×4 (the number of columns) electrode units for example, and both the first electrode layer 10 and the second electrode layer 30 are electrode layers made of conductive materials such as metal or metal oxide (such as Indium Tin Oxide (ITO)). However, the protection scope of the disclosure is not limited to these materials. The numbers of the electrode units in the first electrode layer 10 and the second electrode layer 30 may be specifically set according to an actual situation. That is, the number of rows and the number of columns of the electrode units in the first electrode layer 10 and the second electrode layer 30 may be equal or not equal, and the materials constituting the first electrode layer 10 and the second electrode layer 30 may be the same or different. The organic light emitting layer 20 is divided into a plurality of organic light emitting units by a pixel limiting layer on the second electrode layer 30. The organic light emitting units and the corresponding electrode units in the first electrode layer 10 and the second electrode layer 30 form independent light emitting display units 40.

In addition, as shown in FIG. 1, the display layer comprises a first display region I and a second display region II. In the following descriptions of the disclosure, the first display region I is a fingerprint identification region, and the second display region II is a display region of the display apparatus. However, the protection scope of the disclosure is not limited to this. All measures for implementing the objectives of the disclosure by using the technical solutions (including the first display region I and the second display region II) of the disclosure shall all fall within the protection scope of the disclosure.

In an embodiment of the disclosure, as shown in FIG. 1, the display units 40 comprise a plurality of first units and second units. In the following descriptions, each of the first units is an intact organic light emitting diode unit and comprises a first electrode unit 41, an organic light emitting unit and a second electrode unit 42 which are stacked, and each of the second units is a non-intact organic light emitting diode unit and comprises an organic light emitting unit or further comprises one of the first electrode unit 41 and the second electrode unit 42. That is, the second units are located in a region corresponding to the openings of the first electrode layer 10 and/or the second electrode layer 30. Therefore, it should be understood that, the "display unit" in the disclosure indicates that this unit is a module or unit in the display layer instead of certainly having a display function. The first electrode units 41 and the second electrode units 42 are independent quadrangles of the same shapes. The first electrode layer 10 (the second electrode layer 30) is a continuous film layer having a plurality of openings 43, or comprises the separated (non-continuous) first electrode units 41 (second electrode units 42) prepared on the same layer and having the same shapes. The first units have the same polygons shapes, and the second units have the same polygons shapes, so as to guarantee regular and uniform distribution of light-transmitting regions, namely lights emitted from the light-transmitting regions are uniformly distributed, which not only simplifies the processing steps of the subsequent fingerprint identification algorithm, but also allows the display apparatus to have relatively high display resolution.

When the first display region I is a fingerprint identification region, and the second display region II is a normal display region, the first display region I comprises the first units and the second units, and the second display region II only comprises the first units, so the light transmittance of the fingerprint identification region is improved without affecting the light transmittance of the second display region II in the display apparatus. However, the protection scope of the disclosure is not limited to this. The second display region II also may comprise both the first units and the second units.

As shown in FIG. 1, the driver units in the driver layer 50 comprise third units 51 and fourth units 52. The third units 51 comprise driver circuits, and the fourth units 52 do not comprise driver circuits. Therefore, it should be understood that "not each of the driver units comprises a driver circuit for driving each of the display units" or "not each of the driver units comprises a driver circuit" refers to that some of the driver units comprise the driver circuits, and some of the driver units do not comprise the driver circuits. The term "driver unit" in the disclosure indicates that this unit is a module or unit in the driver layer instead of certainly having a driver function.

In addition, technical features involved in different implementation modes of the disclosure described below may be mutually combined as long as they do not constitute conflicts.

Embodiment 1

As a metal electrode has certain light blocking property, in the display layer of the first display region I, by removing the electrode units, located in a region corresponding to the first electrode layer 10 and/or a region corresponding to the second electrode layer 30, in the display units 40, namely by forming the second units, the light-transmitting regions may be formed. In addition, the first electrode layer 10 and the second electrode layer 30, which are subjected to partial removal of the electrode units, in the display layer still have completely overlapped parts in a stacking direction (the up-down direction, hereinafter referred to as "a stacking direction perpendicular to the plane") perpendicular to a plane where the display apparatus (the display unit) is placed, namely they still comprise the first units having the intact organic light emitting diode structures in the first display region I. When the first display region I is a fingerprint identification region, lights for identifying a fingerprint may be emitted from the light-transmitting regions, so that the identification sensitivity is high. Furthermore, the first display region I further comprises the first units having intact organic light emitting diode structures, so as not to affect the display function of the first display region I.

Figure 2:
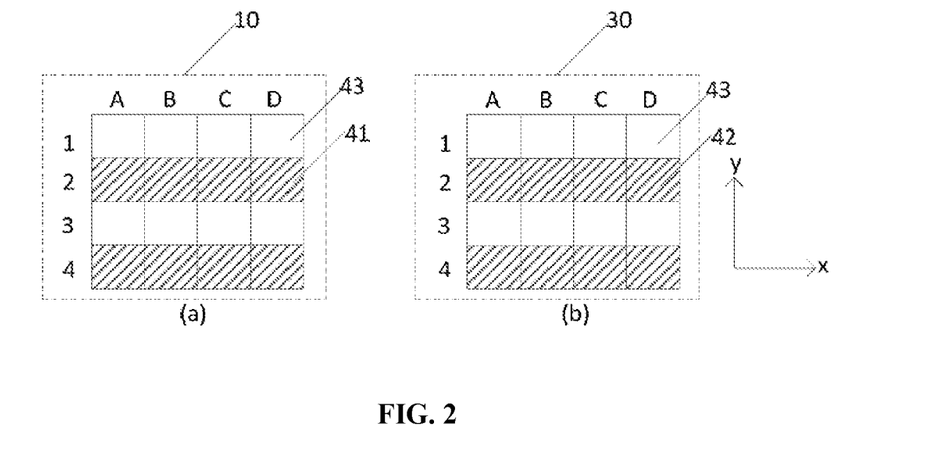
FIG. 2 is a structural schematic diagram of a first electrode layer and a second electrode layer in an Embodiment 1 of the disclosure.

As an embodiment of the disclosure, as shown in FIG. 2 showing the first display region I, each of the first electrode layer 10 and the third electrode layer 30 comprises electrode units arranged in 4 rows and 4 columns respectively. 1, 2, 3 and 4 in the figure respectively represent the rows of the electrode units, arranged along the y direction, in the first electrode layer 10 and the second electrode layer 30, and A, B, C and D respectively represent the columns of the electrode units, arranged along the x direction, in the first electrode layer 10 and the second electrode layer 30. FIG. 2(a) and FIG. 2(b) are respectively structural schematic diagrams of the first electrode layer 10 and the second electrode layer 30. The first electrode layer 10 and the second electrode layer 30 have the same division mode for the electrode units. For example, if the electrode unit in the first row and $A^{th}$ column in FIG. 2(a) is represented by A1, the electrode unit in FIG. 2(b) is represented by A1 as well in correspondence to the A1 region in FIG. 2(a).

As shown in FIG. 2, in the x direction, the second row and the fourth row of the first electrode layer 10 are composed of the first electrode units 41, and the second row and the fourth row of the second electrode layer 30 are composed of second electrode units 42. The rest regions are the openings 43.

Four continuously arranged openings 43 are used to constitute a first unit row, and four continuously arranged first electrode units 41/second electrode units 42 are used to constitute a second unit row. Furthermore, the first unit rows and the second unit rows are alternately arranged to form the first electrode layer 10 and the second electrode layer 30 which are composed of the 4×4 electrode units. That is, in the fingerprint identification region I, by regularly removing the electrode units at corresponding positions in the first electrode layer 10 and the second electrode layer 30 every other row, the objective of improving the light transmittance of the first display region I is achieved, and thus the identification sensitivity of the fingerprint module is improved.

In the first display region I, as shown in FIG. 1, the driver units corresponding to the first units are the third units 51, and the driver units corresponding to the second units are the fourth units 52. The third units 51 comprise driver circuits, and the fourth units 52 do not comprise the driver circuits. By removing the driver circuits, corresponding to the second units (which do not have the intact organic light emitting diode structures), in the driver layer 50, it can be guaranteed that the lights may be emitted from the light-transmitting regions without obstruction, and the identification sensitivity is high.

As a first replaceable implementation mode of the present embodiment, the number of the first unit rows and the number of the second unit rows are not limited to this. That is, the specific numbers may be correspondingly set according to the actual size of the display apparatus and the requirement for the display resolution.

As a replaceable implementation mode of the present embodiment, the shapes of the first electrode units 41 and the shapes of the second electrode units 42 are not limited to this, and may be of any polygons. To simplify the process, the second electrode layer 30 also may be a continuous film layer having a plurality of the openings 43, or comprises the separated second electrode units 42 prepared on the same layer and having the same shapes.

As a replaceable implementation mode of the disclosure, in the first display region I, part of the driver units corresponding to the first units are the third units 51, and part of the driver units are the fourth units 52 as long as display units capable of emitting lights normally exist in the first display region I.

Embodiment 2

Figure 3:
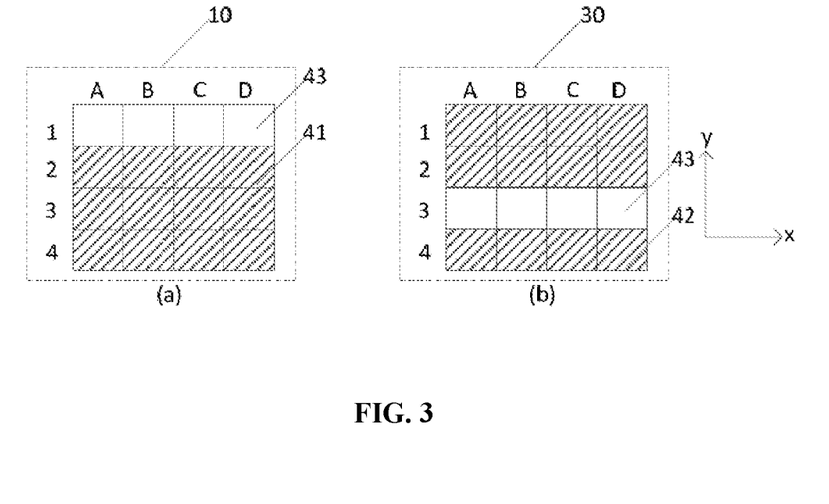
FIG. 3 is a structural schematic diagram of a first electrode layer and a second electrode layer in an Embodiment 2 of the disclosure.

The present embodiment provides a display apparatus, as shown in FIG. 3 showing the first display region I. The first electrode units 41 in the second row in FIG. 3(a) and the second electrode units 42 in the second row in FIG. 3(b) form intact organic light emitting diode structures with the organic light emitting units. The first electrode units 41 in the fourth row in FIG. 3(a) and the second electrode units 42 in the fourth row in FIG. 3(b) form intact organic light emitting diode structures with the organic light emitting units. Only one of the first row in FIG. 3(a) and the first row in FIG. 3(b) has electrode units, and only one of the third row in FIG. 3(a) and the third row in FIG. 3(b) has electrode units, so the first row in FIG. 3(a) and the first row in FIG. 3(b) cannot form intact organic light emitting diode structures with the organic light emitting units, and the third row in FIG. 3(a) and the third row in FIG. 3(b) cannot form intact organic light emitting diode structures with the organic light emitting units either, so no lights can be emitted. However, this allows the first display region I has certain light transmittance, so the overall light transmittance of the first display region I is improved.

As an embodiment of the present disclosure, in the present embodiment, all the driver units corresponding to the display units 40 are the third units 51.

As a replaceable implementation mode of the disclosure, the driver units corresponding to the second units are the fourth units 52, and thus the overall light transmittance of the first display region I may be further improved.

Embodiment 3

Figure 4:
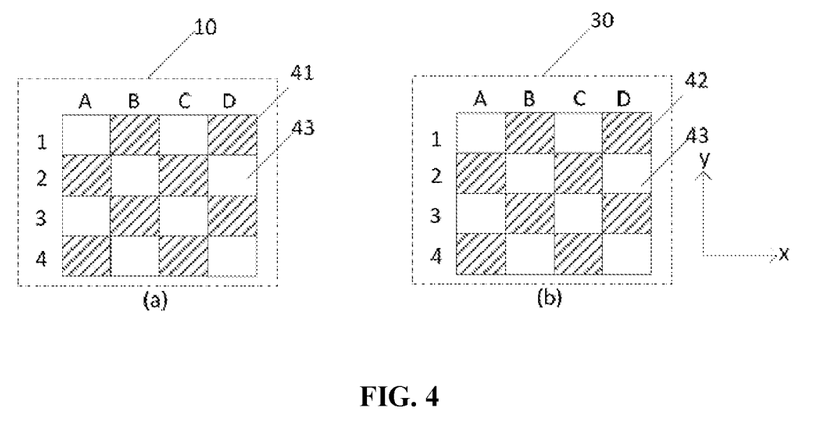
FIG. 4 is a structural schematic diagram of a first electrode layer and a second electrode layer in an Embodiment 3 of the disclosure.

The present embodiment provides a display apparatus, as shown in FIG. 4 showing the first display region I. In the x direction and the y direction, the first electrode units 41 and the openings 43 in the first electrode layer 10 are alternately arranged, and the second electrode units 42 and the openings 43 in the second electrode layer 30 are alternately arranged.

The first electrode units 41/second electrode units 42 and the openings 43 are regularly and alternately arranged to form the first electrode layer 10 and the second electrode layer 30 which are composed of 4×4 electrode units. That is, in the first display region I, the electrode units at corresponding positions in the first electrode layer 10 and the second electrode layer 30 are removed every other electrode unit, namely projections of the first electrode layer 10 and the second electrode layer 30 which are subjected to removal of the electrode units in the display layer are completely overlapped in the stacking direction perpendicular to the plane, so the overall light transmittance of the first display region I is improved. In addition, the whole lights of the display apparatus are transmitted more uniformly, so that the processing steps of the subsequent fingerprint identification algorithm may be simplified, and the display units 40 capable of emitting lights independently may be distributed uniformly to achieve relatively high display resolution.

As an embodiment of the present embodiment, in the present embodiment, all the driver units corresponding to the display units 40 are the third units 51.

As a replaceable implementation mode of the disclosure, the driver units corresponding to the second units are the fourth units 52, and thus the overall light transmittance of the first display region I may be further improved.

Embodiment 4

Figure 5:
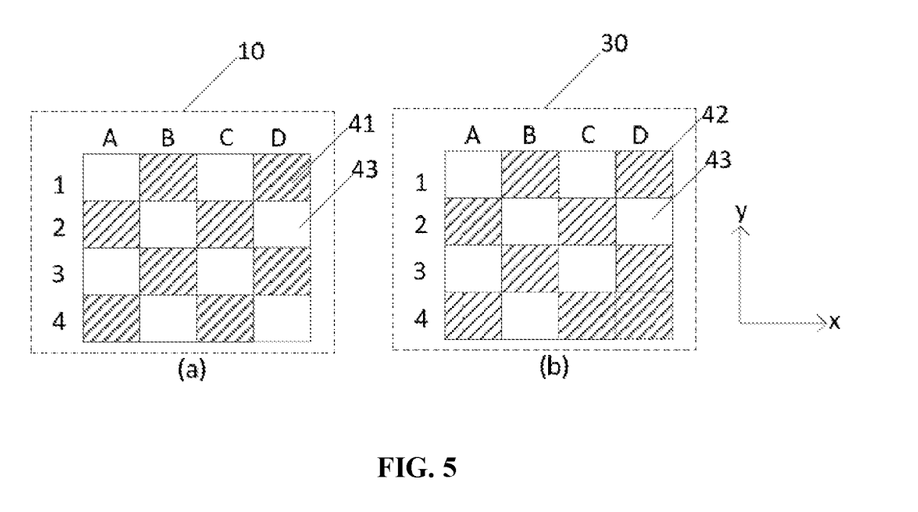
FIG. 5 is a structural schematic diagram of a first electrode layer and a second electrode layer in an Embodiment 4 of the disclosure.

The present embodiment provides a display apparatus, as shown in FIG. 5 showing the first display region I. The first electrode units 41 and the openings 43 in the first electrode layer 10 are alternately arranged. That is, the first electrode layer 10 is formed by removing the electrode units every other electrode unit, and part of the second electrode units 42 and the openings 43 in the second electrode layer 30 are alternately arranged, and part of the second electrode units 42 or the openings 43 are continuously arranged. For example, as shown in FIG. 5(*b*), the second electrode units C4 and D4 in the second electrode layer 30 are continuously arranged, and the rest second electrode units 42 and the openings 43 are alternately arranged. The effect of improving the overall light transmittance of the first display region I may be achieved as long as projections of the first electrode layer 10 and the second electrode layer 30, which are subjected to the removal of the electrode units, of the display layer in the stacking direction perpendicular to the plane have overlapped parts.

As an embodiment of the present disclosure, in the present embodiment, all the driver units corresponding to the display units 40 are the third units 51.

As a replaceable implementation mode of the disclosure, the driver units corresponding to the second units are the fourth units 52, and thus the overall light transmittance of the first display region I may be further improved.

Embodiment 5

Figure 6:
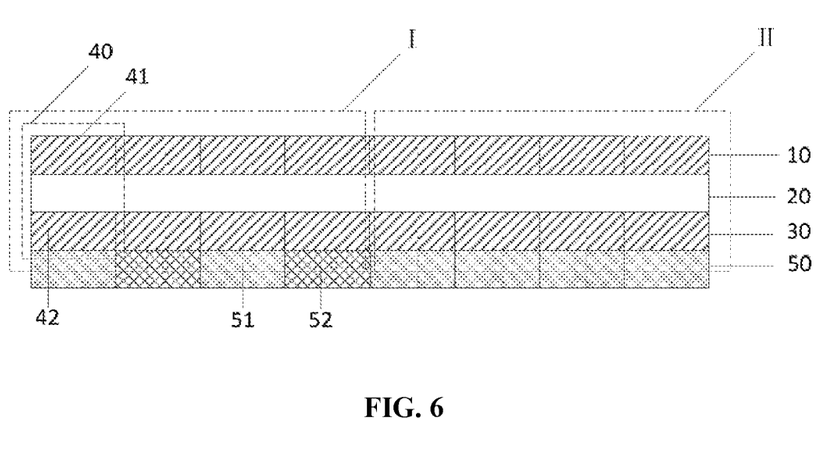
FIG. 6 is a structural schematic diagram of a longitudinal cross section of a display apparatus in an Embodiment 5 of the disclosure.

The present embodiment provides a display apparatus. As shown in FIG. 6, in the first display region I and the second display region II, the first electrode layer 10 and the second electrode layer 30 are overlapped, and each of the display units 40 has an intact organic light emitting diode structure.

The driver units, corresponding to the first display region I, in the driver layer 50 are the third units 51 and the fourth units 52 which are alternately arranged. Metal elements (lead wires, source and drain electrodes, gate electrodes, capacitance plates and the like) in the driver units have certain light blocking property, part of the driver units in the driver layer 50 are configured as the fourth units 52 not including the driver circuits, and may form light-transmitting regions in the display apparatus. When the first display region I is a fingerprint identification region, lights for reading a fingerprint are easily emitted from the light-transmitting regions, so that the fingerprint identification sensitivity is high.

As a replaceable implementation mode of the present embodiment, the type of the driver units in the driver layer 50 is not limited as long as at least one of the driver units in the driver layer 50 is the fourth unit 52 to form the light-transmitting region.

Obviously, the above-mentioned embodiments are merely examples taken for clear descriptions, but not intended to limit the implementation modes. Those of ordinary skill in the art can further make other changes or modifications in different forms on the basis of the above-mentioned descriptions. Here, it is unnecessary and may not enumerate all implementation modes. Obvious changes or modifications caused therefrom shall still fall within the protection scope of the disclosure.

The invention claimed is:

1. A display apparatus, comprising a first display region serving as a fingerprint identification region and a second display region serving as a display region, and comprising a display layer and a driver layer stacked in a stacking direction perpendicular to a plane where the display apparatus is placed, and the display layer comprising a first electrode layer and a second electrode layer stacked in the stacking direction, and the driver layer comprising a plurality of driver units; and in the first display region, the first electrode layer having a first part corresponding to the first display region, the second electrode layer having a second part corresponding to the first display region, and a projection of the first part in the stacking direction and a projection of the second part in the stacking direction being not completely overlapped, wherein in the first display region, the first electrode layer and the second electrode layer have a plurality of openings, and the first electrode layer and the second electrode layer comprise a plurality of electrode units, a first row of the first electrode layer in a y direction is formed by the openings, and second, third and fourth rows of the first electrode layer in the y direction are formed by the electrode units, and a third row of the second electrode layer in the y direction is formed by the openings, and first, second and fourth rows of the second electrode layer in the y direction are formed by the electrode units.

2. The display apparatus according to claim 1, wherein the openings are arranged in rows, and the electrode units are arranged in rows; and the number of the rows arranged by the openings is less than the number of the rows arranged by the electrode units.

3. The display apparatus according to claim 2, wherein in the stacking direction, a projection of at least one of the electrode units in the first electrode layer is overlapped with a projection of a corresponding number of the electrode units in the second electrode layer.

4. The display apparatus according to claim 1, wherein in the stacking direction, a projection of at least one of the electrode units in the first electrode layer is overlapped with a projection of a corresponding number of the electrode units in the second electrode layer.

5. The display apparatus according to claim 1, wherein the first electrode unit and the second electrode unit have the same independent quadrangles shapes.

6. The display apparatus according to claim 1, wherein the first electrode layer is a continuous film layer having a plurality of openings, or comprises the separated first electrode units prepared on the same layer and having the same shapes.

7. The display apparatus according to claim 1, wherein the second electrode layer is a continuous film layer having a plurality of openings, or comprises the separated second electrode units prepared on the same layer and having the same shapes.

8. The display apparatus according to claim 1, wherein the first units have the same polygons shapes, and the second units have the same polygons shapes.

9. The display apparatus according to claim 1, wherein not each of the driver units comprises a driver circuit.

10. The display apparatus according to claim 1, wherein the number of the first units is equal to the number of the second units.

* * * * *